(12) United States Patent
Wei et al.

(10) Patent No.: US 9,450,073 B2
(45) Date of Patent: Sep. 20, 2016

(54) SOI TRANSISTOR HAVING DRAIN AND SOURCE REGIONS OF REDUCED LENGTH AND A STRESSED DIELECTRIC MATERIAL ADJACENT THERETO

(75) Inventors: Andy Wei, Dresden (DE); Thorsten Kammler, Ottendorf-Okrilla (DE); Roman Boschke, Dresden (DE); Casey Scott, Dresden (DE)

(73) Assignee: Advanced Micro Devices, Inc., Sunnyvale, CA (US)

( * ) Notice: Subject to any disclaimer, the term of this patent is extended or adjusted under 35 U.S.C. 154(b) by 2018 days.

(21) Appl. No.: 11/936,855

(22) Filed: Nov. 8, 2007

(65) Prior Publication Data

US 2008/0237712 A1 Oct. 2, 2008

(30) Foreign Application Priority Data

Mar. 30, 2007 (DE) .................. 10 2007 015 504

(51) Int. Cl.
| | |
|---|---|
| *H01L 27/12* | (2006.01) |
| *H01L 29/66* | (2006.01) |
| *H01L 29/78* | (2006.01) |
| *H01L 21/762* | (2006.01) |
| *H01L 21/84* | (2006.01) |
| *H01L 29/417* | (2006.01) |
| *H01L 29/786* | (2006.01) |

(52) U.S. Cl.
CPC ..... *H01L 29/6659* (2013.01); *H01L 21/76264* (2013.01); *H01L 21/84* (2013.01); *H01L 27/1203* (2013.01); *H01L 29/41766* (2013.01); *H01L 29/66636* (2013.01); *H01L 29/66772* (2013.01); *H01L 29/7842* (2013.01); *H01L 29/7843* (2013.01); *H01L 29/7848* (2013.01); *H01L 29/78654* (2013.01); *H01L 29/665* (2013.01)

(58) Field of Classification Search
USPC .......................................... 257/347, E27.112
See application file for complete search history.

(56) References Cited

U.S. PATENT DOCUMENTS

| | | | | |
|---|---|---|---|---|
| 5,510,296 | A | * | 4/1996 | Yen et al. ................. 438/649 |
| 5,841,171 | A | * | 11/1998 | Iwamatsu et al. ............ 257/347 |
| 5,965,917 | A | * | 10/1999 | Maszara et al. ............. 257/347 |
| 6,342,421 | B1 | | 1/2002 | Mitani et al. ................. 438/300 |
| 6,867,433 | B2 | * | 3/2005 | Yeo et al. ........................ 257/67 |
| 6,900,502 | B2 | * | 5/2005 | Ge et al. ........................ 257/347 |
| 2002/0036320 | A1 | * | 3/2002 | Ichimori et al. ............ 257/347 |
| 2004/0169269 | A1 | | 9/2004 | Yeo et al. ..................... 257/692 |

(Continued)

FOREIGN PATENT DOCUMENTS

WO  WO 2005/062364  7/2005  .......... H01L 21/331

OTHER PUBLICATIONS

Official Communication for Serial No. 102007015504.4-33 Dated Mar. 21, 2008.

(Continued)

*Primary Examiner* — Jesse Y Miyoshi

(57) ABSTRACT

By reconfiguring material in a recess formed in drain and source regions of SOI transistors, the depth of the recess may be increased down to the buried insulating layer prior to forming respective metal silicide regions, thereby reducing series resistance and enhancing the stress transfer when the corresponding transistor element is covered by a highly stressed dielectric material. The material redistribution may be accomplished on the basis of a high temperature hydrogen bake.

23 Claims, 11 Drawing Sheets

(56) References Cited

U.S. PATENT DOCUMENTS

| | | | |
|---|---|---|---|
| 2004/0217420 A1 | 11/2004 | Yeo et al. | 257/347 |
| 2005/0082614 A1 | 4/2005 | Takehiro | 257/347 |
| 2005/0110082 A1* | 5/2005 | Cheng et al. | 257/341 |
| 2005/0145938 A1 | 7/2005 | Lin | 257/347 |
| 2005/0285187 A1 | 12/2005 | Bryant et al. | 257/335 |
| 2006/0022268 A1 | 2/2006 | Oh et al. | 257/347 |
| 2008/0001182 A1* | 1/2008 | Chen et al. | 257/255 |

OTHER PUBLICATIONS

PCT Search Report from PCT/US2008/004065 dated Oct. 13, 2008.

* cited by examiner

SOI TRANSISTOR HAVING DRAIN AND SOURCE REGIONS OF REDUCED LENGTH AND A STRESSED DIELECTRIC MATERIAL ADJACENT THERETO

BACKGROUND OF THE INVENTION

1. Field of the Invention

Generally, the subject matter disclosed herein relates to the formation of integrated circuits, and, more particularly, to the formation of transistors having strained channel regions by using stress sources, stressed overlayers and the like to enhance charge carrier mobility in the channel region of a MOS transistor.

2. Description of the Related Art

Generally, a plurality of process technologies are currently practiced in the field of semiconductor production, wherein, for complex circuitry, such as microprocessors, storage chips and the like, CMOS technology is currently the most promising approach due to the superior characteristics in view of operating speed and/or power consumption and/or cost efficiency. During the fabrication of complex integrated circuits using CMOS technology, millions of transistors, i.e., N-channel transistors and P-channel transistors, are formed on a substrate including a crystalline semiconductor layer. A MOS transistor, irrespective of whether an N-channel transistor or a P-channel transistor is considered, comprises so-called PN junctions that are formed by an interface of highly doped drain and source regions with an inversely or weakly doped channel region disposed between the drain region and the source region.

The conductivity of the channel region, i.e., the drive current capability of the conductive channel, is controlled by a gate electrode formed near the channel region and separated therefrom by a thin insulating layer. The conductivity of the channel region, upon formation of a conductive channel due to the application of an appropriate control voltage to the gate electrode, depends on the dopant concentration, the mobility of the majority charge carriers and, for a given extension of the channel region in the transistor width direction, on the distance between the source and drain regions, which is also referred to as channel length. Hence, in combination with the capability of rapidly creating a conductive channel below the insulating layer upon application of the control voltage to the gate electrode, the overall conductivity of the channel region substantially determines the performance of the MOS transistors. Thus, the reduction of the channel length is a dominant design criterion for accomplishing an increase in the operating speed and packing density of the integrated circuits.

The continuing shrinkage of the transistor dimensions, however, involves a plurality of issues associated therewith that have to be addressed so as to not unduly offset the advantages obtained by steadily decreasing the channel length of MOS transistors. One major problem in this respect is providing low sheet and contact resistivity in drain and source regions and any contacts connected thereto and maintaining channel controllability. For example, reducing the channel length may necessitate an increase of the capacitive coupling between the gate electrode and the channel region, which may call for reduced thickness of the gate insulation layer. Presently, the thickness of silicon dioxide based gate insulation layers is in the range of 1-2 nm, wherein a further reduction may be less desirable in view of leakage currents which typically exponentially increase when reducing the gate dielectric thickness.

The continuous size reduction of the critical dimensions, i.e., the gate length of the transistors, necessitates the adaptation and possibly the new development of highly complex process techniques concerning the above-identified problems. It has been proposed to improve transistor performance by enhancing the channel conductivity of the transistor elements by increasing the charge carrier mobility in the channel region for a given channel length, thereby offering the potential for achieving a performance improvement that is comparable with the advance to a future technology node while avoiding or at least postponing many of the above-mentioned problems such as gate dielectric scaling. One efficient mechanism for increasing the charge carrier mobility is the modification of the lattice structure in the channel region, for instance by creating tensile or compressive stress in the vicinity of the channel region to produce a corresponding strain in the channel region, which results in a modified mobility for electrons and holes, respectively. For example, for standard silicon substrates, creating tensile strain in the channel region increases the mobility of electrons, which in turn may directly translate into a corresponding increase in the conductivity and thus drive current and operating speed. On the other hand, compressive strain in the channel region may increase the mobility of holes, thereby providing the potential for enhancing the performance of P-type transistors. The introduction of stress or strain engineering into integrated circuit fabrication is an extremely promising approach for further device generations, since, for example, strained silicon may be considered as a "new" type of semiconductor material, which may enable the fabrication of fast powerful semiconductor devices without requiring expensive semiconductor materials, while many of the well-established manufacturing techniques may still be used.

According to one promising approach, stress may be created by, for instance, layers located close to the transistor, spacer elements and the like to induce a desired strain within the channel region. However, the process of creating the strain in the channel region by applying a specified external stress may suffer from an inefficient translation of the external stress into strain in the channel region. Hence, although providing significant advantages, the efficiency of the stress transfer mechanism may depend on the process and device specifics and may result in a reduced performance gain for well-established standard transistor designs, since the overlaying layer may be significantly offset from the channel region, thereby reducing the strain finally created in the channel region. Therefore, recessed transistor architectures have been proposed for enhancing the lateral stress transfer.

With reference to FIGS. 1a-1g, conventional strategies for forming recessed transistor architectures will now be described in more detail in order to explain principal advantages of this device configuration and also describe problems, especially involved with SOI (silicon-on-insulator) architectures.

FIG. 1a schematically illustrates a top view of a semiconductor device 100 comprising a transistor element 150. The transistor element 150 typically comprises drain and source regions 151 and a gate electrode 152, which may have formed on the sidewalls thereof respective sidewall spacers 153. Furthermore, respective contacts 157 may extend substantially perpendicular to the drawing plane of FIG. 1a so as to establish electrical connections of the drain and source regions 151 to a respective higher wiring level (not shown). Furthermore, a respective dielectric material for passivating the material 150 may not be shown in FIG. 1a so as to not unduly obscure the respective structure of the transistor element 150.

FIG. 1b schematically illustrates a cross-sectional view of the semiconductor device 100 taken along the line Ib-Ib of FIG. 1a. First, a substantially planar configuration is shown in FIG. 1b in order to demonstrate the advantages of a recessed transistor configuration, as will be explained in more detail with reference to FIGS. 1c-1d. In FIG. 1b, the semiconductor device 100 comprises a substrate 101, which represents a bulk silicon substrate including, on an upper portion thereof, a semiconductor layer 102. Hence, the transistor 150 may represent a bulk transistor wherein the drain and source regions 151 and a corresponding channel region 155 are electrically connected to the substrate 101. Moreover, in this manufacturing stage, respective metal silicide regions 154 may also be formed on the gate electrode 152 and in the drain and source regions 151, wherein a corresponding lateral offset to the gate electrode 152 may be substantially defined by the spacer structure 153. For convenience, the metal silicide regions 154 are not shown in FIG. 1a.

Moreover, a strain-inducing dielectric layer 103, for instance a silicon nitride layer, is formed above the transistor 150 so as to induce a desired type of strain in the channel region 155. Typically, the dielectric layer 103 may represent a portion of an interlayer dielectric material provided to encapsulate the transistor 150 prior to forming respective wiring levels or metallization layers (not shown) which provide the required electrical connections of respective circuit elements in the semiconductor device 100. When the transistor 150 represents an N-channel transistor, tensile strain in the channel region 155 may significantly enhance the electron mobility therein, thereby providing enhanced transistor performance. In this case, the dielectric material of the layer 103 may be provided with a high intrinsic tensile stress in order to mechanically transfer stress into the channel region 155.

It should be appreciated that highly efficient strain-inducing mechanisms may be available for P-channel transistors, such as the provision of embedded silicon/germanium material in the respective drain and source regions 151, thereby enabling significant transistor improvements for PMOS transistors, wherein, additionally, appropriately stressed dielectric materials, such as the layer 103, may be provided, however, in this case, with a high compressive stress, in order to even further enhance the overall transistor performance. Silicon nitride is well known to be capable of being provided with high intrinsic stress, wherein well-established deposition techniques on the basis of plasma enhanced chemical vapor deposition (PECVD) result in high intrinsic stress, wherein extremely high compressive values may be obtained, while a respective tensile strain is less pronounced. Consequently, in the following, it may be assumed that the transistor 150 may represent an N-channel transistor whose performance is to be further enhanced in order to reduce the imbalance in performance gain of P-channel transistors and N-channel transistors by strain engineering techniques. For example, the respective mechanical transfer of stress into the channel region 155 may be enhanced by recessing the drain and source regions 151 in order to provide an increased "direct" stress component acting substantially laterally on the channel region 155.

FIG. 1c schematically illustrates the semiconductor device 100 including the transistor 150 with a recessed drain and source architecture. That is, the drain and source regions 151 comprise a surface portion 151R that is located at a significantly lower height level with respect to the channel region 155, when compared with the situation of the substantially planar configuration as shown in FIG. 1b. Therefore, the stressed material of the layer 103 may act in a substantially lateral direction, as previously explained. Additionally, the recessed architecture provides an increased surface area of the metal silicide regions 154 in the drain and source regions 151, since an additional sidewall area 151s of the recessed drain and source regions 151 may be available during the corresponding silicidation process. Consequently, the overall series resistance of the transistor 150 may be reduced compared to the planar configuration as shown in FIG. 1b.

For this reason, the corresponding manufacturing sequence for forming the transistor element 150 as shown in FIG. 1b may be appropriately modified to introduce additional process steps for forming a corresponding recess in the drain and source regions 151 resulting in the transistor configuration as shown in FIG. 1c. For example, well-established process techniques may be used for forming the transistor 150 as shown in FIG. 1c up to a state where the drain and source regions 151 are to be formed in the semiconductor layer 102. During the corresponding process sequence, the implantation sequence may be appropriately designed to obtain the desired depth of the drain and source regions 151 in order to take into consideration the desired degree of recess to be formed therein. As may be evident from the explanation given above, an increased depth of the surface 151R may result in increased performance gain due to the increased efficiency of the stress transfer and the increased amount of metal silicide in the regions 154. Hence, in the bulk transistor configuration as shown in FIG. 1c, a respective adaptation of conventional process techniques may be used to obtain the desired depth of the recessed drain and source regions 151, which may be formed on the basis of an appropriately designed etch process. During the corresponding etch process, other transistor elements, such as P-channel transistors or any other transistors that do not require the recessed configuration, may be appropriately covered by a corresponding etch mask. Thereafter, further processing may be continued on the basis of well-established techniques, for instance by forming the metal silicide regions 154 and depositing the dielectric layer 103 on the basis of appropriate deposition parameters in order to obtain the desired high degree of intrinsic stress. Thereafter, an interlayer dielectric material 104, such as silicon dioxide, may be deposited on the basis of well-established techniques.

FIG. 1d schematically illustrates the transistor 150 of FIG. 1c shown according to a cross-sectional view as indicated by line Id-Id in FIG. 1a. Thus, the contacts 157, which may be comprised of any appropriate conductive material, such as tungsten, copper, silver or any other materials and alloys, may extend through the interlayer dielectric material 104 and the stressed layer 103 to the metal silicide regions 154. The contacts 157 may be formed on the basis of anisotropic etch techniques, wherein the layer 103 may be efficiently used as an etch stop material for first patterning the material 104. Thereafter, the layer 103 may be opened and the resulting openings may be subsequently filled by the desired conductive material. Hence, significant advantages may be obtained by the recessed configuration in terms of strain and series resistance, wherein a respective performance gain is substantially determined by the depth of the respective drain and source regions 151. The depth is substantially limited by the location of the PN junctions of the drain and source regions 151 since the metal silicide regions 154 must not extend beyond the respective PN junctions. Thus, in the bulk configuration, the respective transistor design may be modified to obtain the desired depth of the drain and source regions 151 without shorting the respective PN junctions by appropriately designing the respective dopant profile.

With reference to FIGS. 1e-1g, further advantages of a recessed transistor configuration will be illustrated. In FIG. 1e, the semiconductor device 100 comprises neighboring transistor elements 150A, 150B according to a planar configuration, wherein each of the transistors 150A, 150B may substantially correspond to the transistor as shown in FIG. 1d. In this configuration, the contact 157 may be positioned between the two transistors 150A, 150B, wherein the metal silicide region 154 may provide sufficient drive current capability in order to avoid undue increase of series resistance, since significant current crowding in the metal silicide region 154 may be avoided, although the conductivity of the contact 157 may be significantly higher compared to the conductivity of metal silicide in the region 154, which in turn is significantly higher compared to the conductivity of the drain and source regions 151.

FIG. 1f schematically illustrates the semiconductor device 100 in advanced applications, wherein the corresponding spacing between the neighboring transistors 150A, 150B may be significantly reduced, thereby resulting in a significantly reduced ratio of the lateral extension of the metal silicide region 154 and the contact 157. In the example shown in FIG. 1f, this ratio may even become approximately 1, thereby resulting in a significant current crowding within the metal silicide material, which may unduly reduce the overall performance of the semiconductor device 100 due to increased current crowding at portions 157A.

FIG. 1g schematically illustrates a semiconductor device 100 similar to the device of FIG. 1f wherein, however, a recessed drain and source configuration is used, as is previously explained with reference to FIGS. 1c and 1d. As is evident, due to the increased interface between the contact 157 and the metal silicide region 154 at the areas 157A, undue increase of the series resistance may be avoided or at least reduced, thereby also making the recessed drain and source configuration highly advantageous in semiconductor devices requiring reduced spacings between neighboring transistor elements.

In principle, the recessed transistor configuration may also be advantageous in the context of SOI devices, wherein, however, the depth of the recess of the SOI configuration is limited by the initial thickness of the semiconductor layer formed above the buried insulating layer. Thus, techniques have been proposed to etch the recess close to the buried insulating layer yet maintain sufficient silicon as required by the subsequent silicide process. That is, in order to maintain silicide integrity, a residual layer is maintained, the thickness of which is substantially determined by the silicide thickness required in the gate electrode for obtaining the desired low gate resistance. For example, in modern SOI transistors having a recessed drain/source configuration, a minimum thickness of approximately 20 nm may be required in order to provide process uniformity and silicide integrity. Hence, there is still room for improvement in enhancing performance of SOI transistors having a recessed drain/source configuration.

The present disclosure is directed to various methods and devices that may avoid, or at least reduce, the effects of one or more of the problems identified above.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the subject matter disclosed herein relates to techniques for enhancing the transistor performance by increasing the stress transfer mechanism and/or reducing the series resistance in SOI transistors by providing SOI transistors having a reduced "drain and source length," thereby providing the potential for forming the strain-inducing material laterally adjacent to the drain and source regions down to the buried insulating layer. Consequently, the strain-inducing material may laterally act along substantially the entire depth of the adjacent drain and source regions, thereby significantly increasing the overall strain in the respective channel region. In some aspects, the exposure of a portion of the buried insulating layer may be accomplished with a high degree of compatibility with other process techniques for forming recessed drain/source configurations, thereby not unduly contributing to additional process complexity. In further aspects, respective process steps may be introduced at any appropriate manufacturing stage so as to not unduly affect the overall process sequence and transistor characteristics.

One illustrative semiconductor device disclosed herein comprises a transistor formed above a buried insulating layer, wherein the transistor comprises drain and source regions located in a semiconductor material formed on the buried insulating layer. The semiconductor device further comprises a strain-inducing layer formed above the transistor, wherein the strain-inducing layer substantially extends to the buried insulating layer adjacent to the drain and source regions.

In one illustrative method disclosed herein, a recess is formed laterally offset from a gate electrode structure of a transistor in a silicon-containing semiconductor layer that is formed on a buried insulating layer. The method further comprises performing a heat treatment in a hydrogen-containing ambient for inducing a material flow in the recess to substantially expose a portion of the buried insulating layer.

In another illustrative method disclosed herein, a recess is formed that is offset from a gate electrode of a field effect transistor, wherein the gate electrode is located above a semiconductor layer which is formed on a buried insulating layer, wherein the recess substantially extends to the buried insulating layer. The method further comprises forming a drain region and a source region adjacent to the gate electrode and forming a dielectric strain-inducing layer above the field effect transistor and within the recess.

BRIEF DESCRIPTION OF THE DRAWINGS

The disclosure may be understood by reference to the following description taken in conjunction with the accompanying drawings, in which like reference numerals identify like elements, and in which.

Figure 1A:
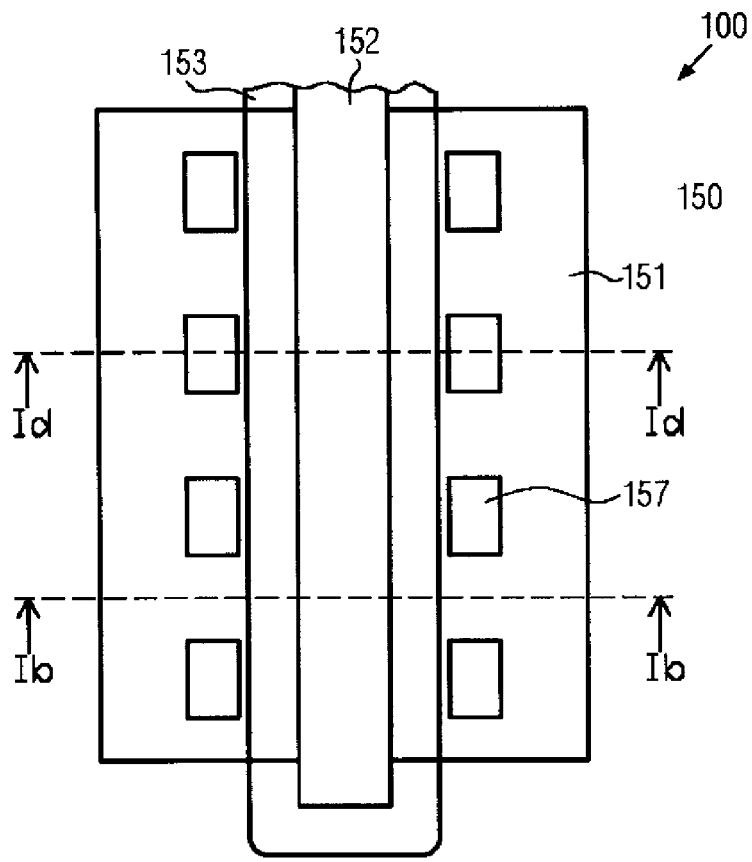
FIG. 1a schematically illustrates a top view of a conventional semiconductor device including a transistor.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION OF THE INVENTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

Generally, the subject matter disclosed herein addresses the limitations in SOI transistors caused by the finite thickness of the active semiconductor layer and the formation of recessed drain and source regions in combination with efficient metal silicide regions. For this purpose, aspects of the subject matter disclosed herein refer to manufacturing techniques, in which a recess may be formed adjacent to the drain and source regions, which may substantially completely extend down to the buried insulating layer, while nevertheless providing sufficient process margins during the subsequent metal silicide processing. Consequently, after the formation of the metal silicide regions, a corresponding strain-inducing dielectric material may be deposited above the substantially exposed portion of the buried insulating layer, thereby significantly enhancing the overall stress transfer mechanism compared to conventional recessed drain/source architectures in SOI devices. Moreover, the overall conductivity from the respective contact portions into the channel region may be enhanced compared to the conventional designs, as previously explained, since further device scaling, and thus reducing the pitch between neighboring transistor elements, may not unduly reduce the overall transistor performance. Since the entire available depth of the active semiconductor layer in an SOI configuration may be available for the stress transfer mechanism, an appropriate adjustment of the overall strain in the respective SOI transistors may be accomplished on the basis of the internal stress of the corresponding dielectric material to be filled in the recess formed adjacent to the drain and source regions. Consequently, a wide bandwidth for adjusting the respective strain characteristics may be provided on the basis of a single process step, i.e., the deposition of the stressed dielectric material which may readily be provided so as to obtain the desired degree of strain in various device regions.

In some aspects, the principles disclosed herein may be applied in a highly selective manner to provide significant performance gain in selected transistor devices, while substantially not affecting other transistor devices. For example, the techniques disclosed herein may be advantageously applied to N-channel transistors in order to provide the high performance gain obtained by strain engineering techniques on the basis of stressed dielectric materials encapsulating a respective SOI transistor. In this case, the imbalance with respect to strain-inducing mechanisms between N-channel transistors and P-channel transistors may be at least partially compensated for by applying these techniques to N-channel transistors only. In other illustrative embodiments, the techniques disclosed herein may be advantageously applied to P-channel transistors and N-channel transistors, which may provide the potential of obtaining enhanced transistor performance based on a single strain-inducing mechanism while at the same time providing enhanced series conductivity, as is previously explained. In still other aspects, the techniques disclosed herein may be advantageously combined with additional strain-inducing sources, such as semiconductor alloys provided in drain and source regions and/or the channel regions.

Consequently, the subject matter disclosed herein should not be considered as being restricted to a single type of transistor, although, in illustrative examples disclosed herein, an SOI N-channel transistor may be referred to.

Figure 2A:
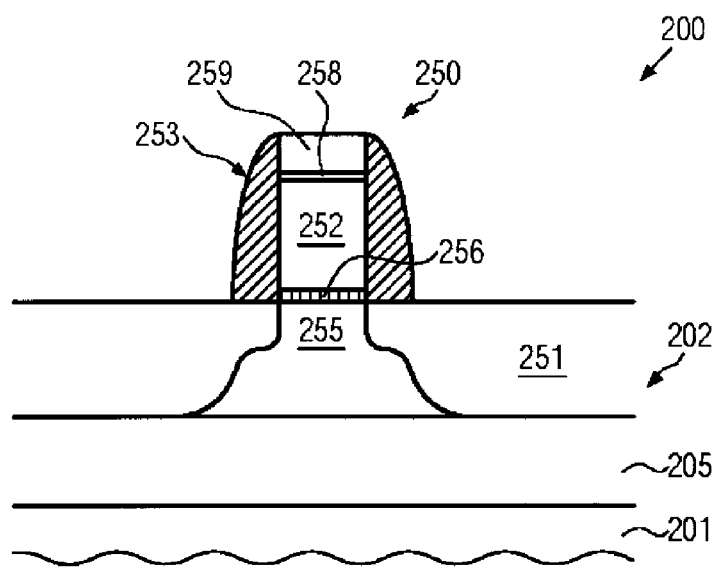
FIGS. 2a-2f schematically illustrate cross-sectional views of a transistor element during various manufacturing stages in forming drain and source regions of reduced length with a recess substantially extending down to the buried insulating layer of an SOI device according to illustrative embodiments.

FIG. 2a schematically illustrates a cross-sectional view of a semiconductor device 200 comprising a substrate 201, which may represent any carrier material for forming thereabove a transistor device according to an SOI configuration. For example, the substrate 201 may represent a silicon substrate as typically used in SOI devices. Furthermore, a buried insulating layer 205 comprised of any appropriate material, such as silicon dioxide, silicon nitride and the like, is formed above the substrate 201 and separates a silicon-based semiconductor layer 202 from the substrate 201. The silicon-based semiconductor layer 202 may represent any appropriate silicon-based material in a substantially crystalline structure, wherein a silicon-based material is to be understood as a semiconductor material comprising a significant amount of silicon, such as approximately 50 volume percent silicon or more, while other species may also be present, such as isoelectronic species, such as germanium, carbon and the like, as well as dopants for adjusting the conductivity of the semiconductor layer 202. The semiconductor layer 202 and the underlying buried insulating layer 205 define an SOI configuration, wherein it should be appreciated that the corresponding SOI configuration may not necessarily extend across the entire substrate 201 but may be locally restricted to respective device areas, in which the advantageous characteristics of SOI transistors may be desired. For instance, the transistor 250 may represent a circuit element in a functional block requiring high operating speed which may be provided by the transistor 250 due to the enhanced performance of SOI transistors, due to reduced parasitic capacitance and the like. In other device areas, a bulk configuration may be provided, for instance by omitting the buried insulating layer 205, when the respective bulk transistors are considered superior for device operation, for instance when considering static memory areas and the like.

In the embodiment shown, the transistor 250 may comprise respective drain and source regions 251 defined by an appropriate lateral dopant profile which may also extend down to the buried insulating layer 205. A channel region 255 is formed between the drain and source regions 251 with a gate electrode structure 252 separated therefrom by a gate insulation layer 256. In sophisticated applications, a gate length of the gate electrode 252, i.e., in FIG. 2a the horizontal extension, may be approximately 50 nm and significantly less, such as 30 nm and less. The gate electrode 252 may be encapsulated by a sidewall spacer structure 253, which may be comprised of any appropriate material, such as silicon nitride, silicon dioxide and the like. For instance, the spacer structure 253 may comprise one or more individual spacer elements, which may be separated from each other by a respective liner material having a high etch selectivity with respect to the spacer material. In other cases, the structure 253 may be formed by a substantially homogenous material composition. Furthermore, a cap layer 259, for instance comprised of substantially the same material as the spacer structure 253, such as silicon nitride, may be formed on top of the gate electrode 252, wherein a respective liner material 258, such as silicon dioxide and the like, may be provided.

The semiconductor device 200 as shown in FIG. 2a may be formed on the basis of the following processes. After providing the substrate 201 having formed thereon, at least locally, the buried insulating layer 205 and the semiconductor layer 202, respective active regions may be defined in the layer 202 corresponding to transistor areas or other semiconductor areas requiring a specific conductivity. For this purpose, appropriate isolation structures (not shown) may be formed and thereafter the required dopant concentration may be introduced for setting transistor characteristics, such as conductivity type, threshold voltage and the like. Next, the gate electrode 252 and the gate insulation layer 256 may be formed based on well-established techniques, wherein sophisticated oxidation and/or deposition techniques may be used for the material of the gate insulation layer 256, followed by the deposition of an appropriate gate electrode material, which may include respective cap materials, anti-reflecting coating (ARC) materials and the like, as required. For instance, the material for the cap layer 259 and the liner 258 may be formed prior to patterning the gate electrode material. The patterning may be performed on the basis of sophisticated lithography and etch techniques, while in other cases the gate electrode 252 may be formed at a later stage by forming a place holder structure and removing the same in a later stage. Thereafter, further process steps may be performed in accordance with device requirements. For instance, in some transistors, strain-inducing mechanisms may be implemented, for instance in the form of semiconductor alloys of any appropriate composition in order to modify the crystalline structure in at least a portion of the respective active region. For instance, respective recesses may be formed and may be refilled with epitaxially grown semiconductor materials, such as silicon/germanium, if compressive strain may be desired in a certain type of transistor, such as P-channel transistors.

In the following, it may be assumed that the transistor 250 may represent an N-channel transistor which may receive an appropriate type of strain in the channel region 255 by a corresponding stressed dielectric material still to be formed, without providing additional strain-inducing sources. Thus, after patterning the gate electrode 252, possibly in combination with the liner 258, which may have a thickness in the range of approximately 2-5 nm, and the cap layer 259, which may have a thickness of approximately 20-40 nm, respective implantation processes may be performed, for instance halo implantation, source/drain extension implantation and the like. For this purpose, an appropriate offset spacer, if required, may be formed followed by the formation of one or more additional spacer elements so as to obtain the spacer structure 253. During the respective steps for forming spacer elements, respective implantation processes may be formed so as to finally obtain the desired lateral profile of the drain and source regions 251.

Figure 2B:
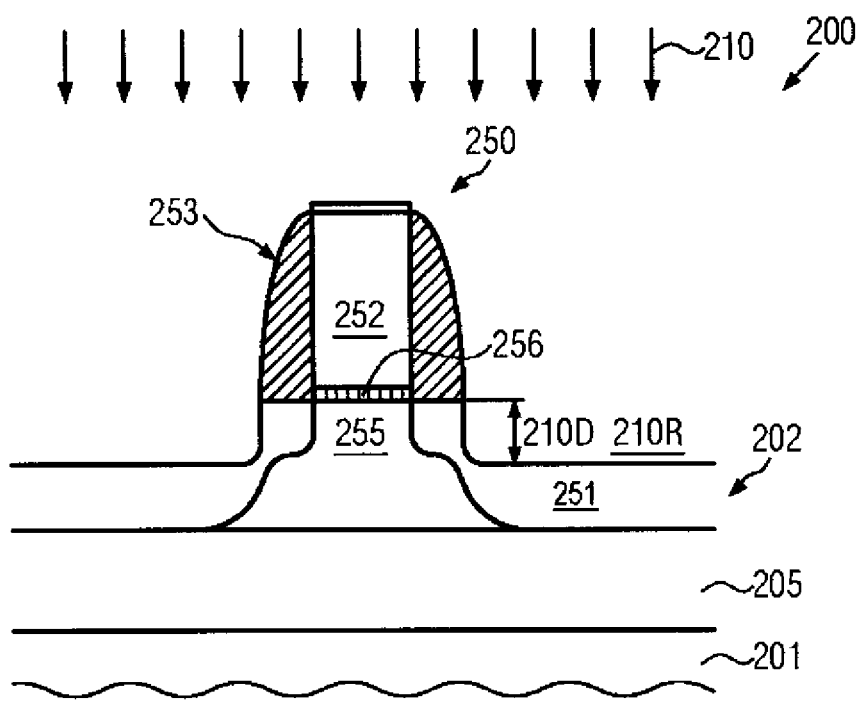

FIG. 2b schematically illustrates the semiconductor device 200 when exposed to the etch ambient of an etch process 210. During the etch process 210, a recess 210R may be formed in the drain and source regions 251 with a predefined depth 210D, which may be selected on the basis of device requirements in view of a subsequent modification of the drain and source regions with respect to a degree of tapering to be formed therein, as will be described later on. For instance, in some illustrative embodiments, the etch process 210 may be designed to exhibit a high degree of compatibility with etch processes for forming recessed drain and source configurations in SOI devices, thereby maintaining a required thickness of the layer 202, as previously explained. Hence, in this case, well-established process recipes may be used. In one embodiment, the etch process 210 may be designed so as to simultaneously etch the material of the spacer structure 253 and the cap layer 259, wherein the etch front may be reliably stopped on the liner 258, thereby substantially avoiding undue damage of the gate electrode 252 when comprised of polysilicon. In other illustrative embodiments, the etch process 210 may include a selective etch process for removing material of the layer 202 with a subsequent selective etch step for removing the cap layer 259 and a portion of the structure 253. Respective selective etch recipes, for instance for silicon, silicon nitride and silicon dioxide, are well established in the art. The etch process 210 may be performed on the basis of an appropriately designed etch mask (not shown) when other areas of the semiconductor device 200 do not need to receive respective recesses 210R. For example, if respective transistor elements have been formed, which may include additional strain-inducing sources, such as embedded semiconductor alloys and the like, the corresponding transistors may not require a further enhancement of strain transfer mechanisms provided by overlaying stressed layers, and hence the corresponding transistors may be covered by a resist mask and the like. In other illustrative embodiments, the recesses 210R may be formed in other types of transistors, such as P-channel transistors, when a corresponding finally desired amount of strain may be adjusted by the amount of intrinsic stress of a corresponding dielectric material to be filled into the recesses 210R in a later manufacturing stage.

Figure 2C:
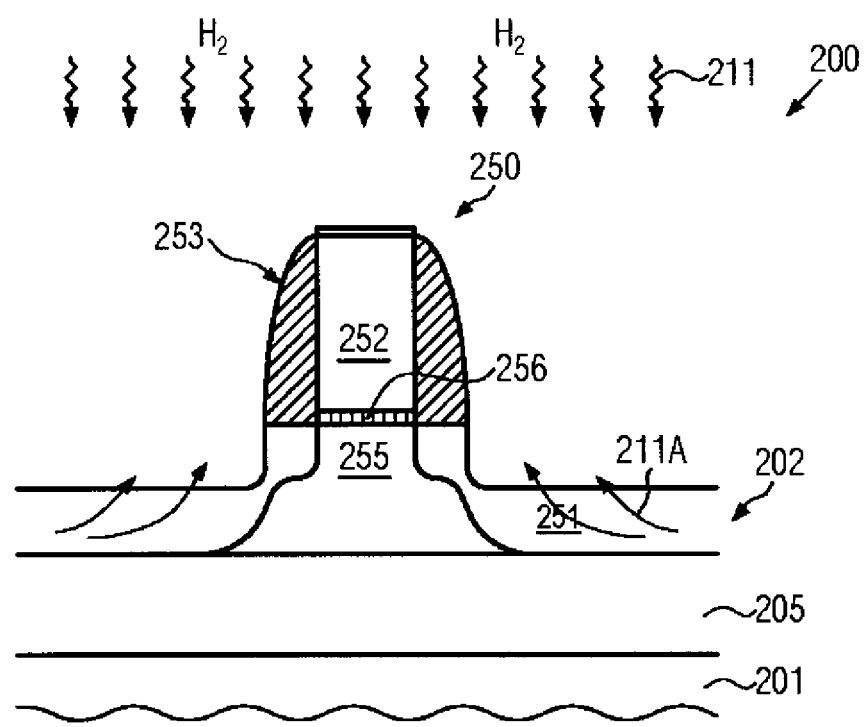

FIG. 2c schematically illustrates the semiconductor device 200 in a further advanced manufacturing stage. Here, the device is subjected to a heat treatment 211 in the presence of a hydrogen ambient in order to initiate a material flow of any non-passivated silicon-based material, i.e., of silicon material in the layer 202, which may not be covered by temperature-resistant materials, such as the spacer structure 253. The heat treatment may be performed at temperatures in the range of 750-1000° C., or in a range of 800-950° C., for a time period of several seconds to several minutes, such as approximately 30 seconds to 5 minutes. During this "high temperature hydrogen bake," the silicon-based material moves in order to reduce its surface area, as indicated by arrows 211A. In some illustrative embodiments, the heat treatment 211 may be performed in a state of the transistor 250 in which respective anneal processes for activating dopants and curing crystalline damage have already been performed, while, in other illustrative embodiments, the heat treatment 211 may be used as a first step of re-crystallizing damaged areas in the drain and source regions 251 and activating, to a certain degree, the corresponding dopant atoms. It should be appreciated that the material flow 211A may be substantially restricted to exposed silicon-based areas in which a respective reduction of the overall exposed surface area is possible. For instance, in other device areas in which substantially planar exposed silicon-containing regions may be subjected to the heat treatment 211, only a reduced material flow may be observed, or, in other embodiments, respective exposed portions may be covered by an appropriate material, such as silicon dioxide, silicon nitride and the like.

Figure 2D:
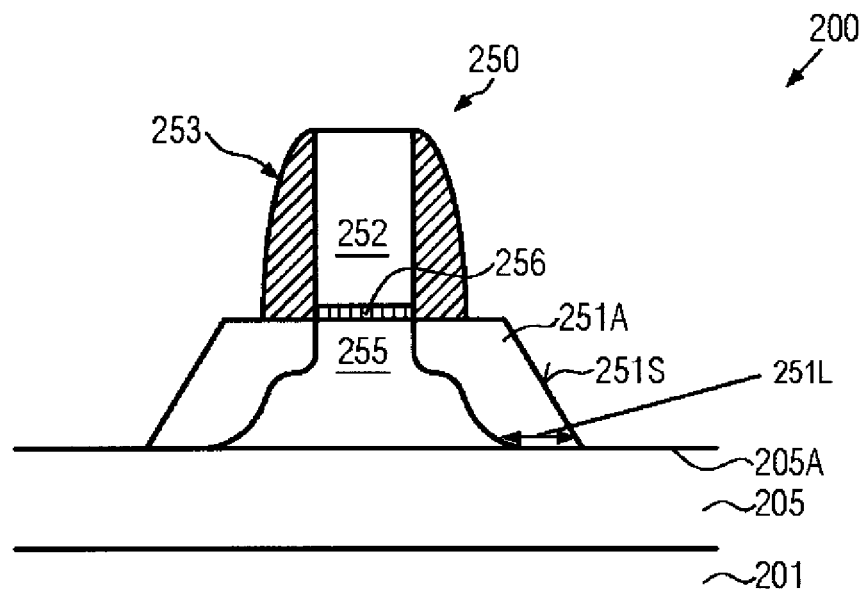

FIG. 2d schematically illustrates the device 200 after the heat treatment 211. As shown, the material flow 211A may result in the removal of the material of the layer 202 previously covering the buried insulating layer 205 and may accumulate adjacent to the gate electrode structure in such a way as to reduce the overall surface area of the silicon material compared to the drain and source regions including the recess 210R. Thus, the previously recessed drain and source regions 251 may comprise an additional portion 251A having a substantially trapezoidal edge 251S due to the preceding heat treatment 211. Consequently, a respective portion 205A of the buried insulating layer 205 may be substantially exposed during the heat treatment 211, thereby also reducing the effective "length" 251L of the drain and source regions 251 at a height level corresponding to the buried insulating layer 205. Since the corresponding dopant atoms in the silicon-based material may have also been transferred to the additional portions 251A, a desired high dopant concentration may still be maintained within the entire drain and source regions 251 having the reduced length. Furthermore, the portion 251A may now be available for a subsequent silicidation process and may provide sufficient process margin in order to avoid an undue shorting of the respective PN junctions, substantially independently of a degree of silicidation as required by the gate electrode 252 so as to reduce the resistance thereof. Furthermore, by appropriately adjusting the depth 210D (FIG. 2b) of the recess 210R, the amount of silicon-based material in the drain and source regions 251 may be adjusted, thereby providing the potential for appropriately dimensioning the size of the additional portion 251A and thus the offset of the edge 251S from the respective PN junctions. Hence, a respective silicidation process may not result in an undue silicide growth into the drain and source regions 251 so as to create the risk for shorting the PN junction.

Figure 2E:
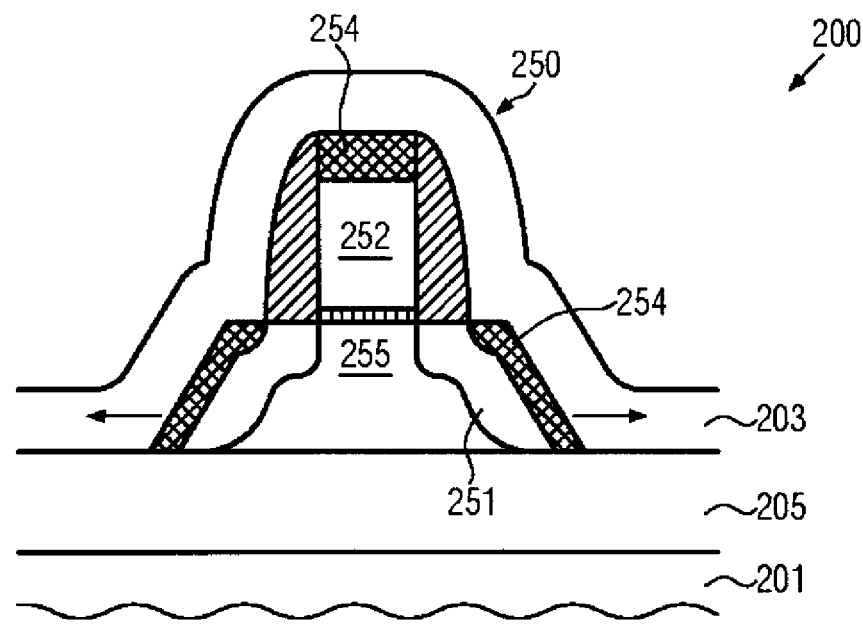

FIG. 2e schematically illustrates the semiconductor device 200 in a further advanced manufacturing stage. Respective metal silicide regions 254 are formed in the gate electrode 252 and the additional portion 251S according to the requirements for a reduced gate resistance, as previously explained. For the corresponding silicidation process, well-established process techniques may be used, wherein non-reacted metals, such as nickel, platinum, cobalt and the like, which may be used for forming the metal silicide regions 254, may be efficiently removed from non-silicon areas, such as the portion 205A of the buried insulating layer 205 and the spacer 253. If a further reduced series resistance may be desired and/or an even further enhanced stress transfer, the spacer structure 253 may be reduced in width by performing a respective selective etch process on the basis of well-established etch recipes. In this case, the offset to the channel region 255 may be reduced, depending on the degree of spacer removal, while nevertheless a risk for PN junction shorting in the lower portion of the drain and source regions 251 may still be avoided due to the additional portion 251A.

After the formation of the metal silicide regions 254, a stressed dielectric material 203 may be provided on the basis of well-established techniques. For example, in the embodiment shown, the layer 203 may comprise dielectric material of high tensile stress in order to create a respective tensile strain in the channel region 255. Since the highly stressed layer 203 may be formed along the entire depth of the drain and source regions 251 and may be in contact with the buried insulating layer 205, that is, the portion 205A, a significantly enhanced stress transfer mechanism may be achieved. In some illustrative embodiments (not shown), a further etch process may be performed in the device 200 as shown in FIG. 2d in order to selectively remove material from the exposed portion 205A of the buried insulating layer on the basis of a selective etch process. In this case, the highly stressed material of the layer 203 may even extend beyond the drain and source regions 251, thereby further enhancing the overall strain-inducing mechanism. During a corresponding etch process, material of respective isolation structures may also be removed, if comprised of substantially the same material as the buried insulating layer 205, which may be acceptable since the corresponding material may then be replaced by material of the layer 203.

Figure 2F:
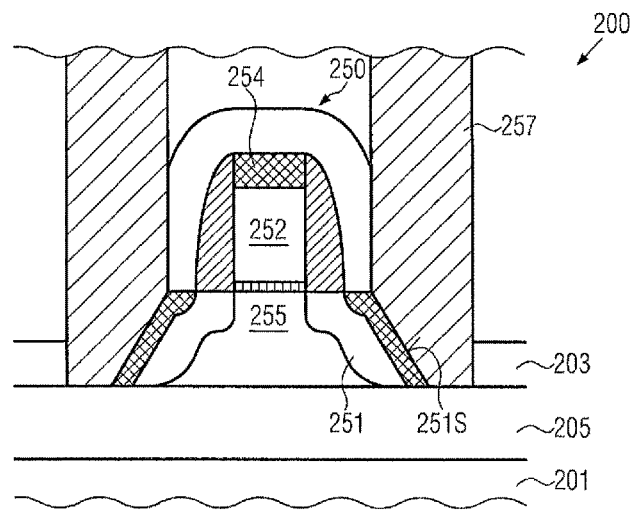

FIG. 2f schematically illustrates the semiconductor device 200 in a cross-sectional view taken along a plane in which respective contacts 253 are provided, similar to the cross-sectional view indicated in FIG. 1a by the line Id-Id. As is evident, the contacts 257 may form an increased interface area with the edge 251S of the metal silicide regions 254 in the drain and source regions 251, due to the substantially tapered form of the respective edges 251S. Even for a slight misalignment of the contact 257, a significant overlap between the contact 257 and the respective metal silicide region 254 may still be obtained so as to result in non-significant current crowding, as previously explained when referring to conventional configuration. Thus, the contact 257 may engage with the metal silicide regions 254 in the drain and source regions 251, thereby forming an angle that is substantially defined by the degree of tapering of the drain and source regions 251. For example, a corresponding angle may be in the range of approximately 20-60 degrees.

Figure 1B:
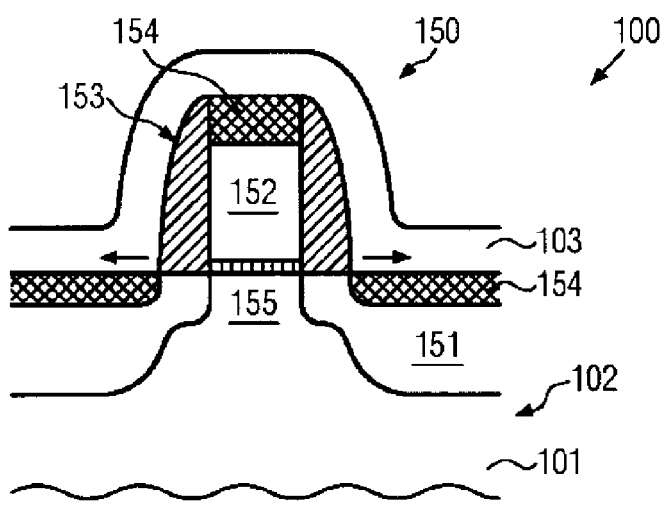
FIGS. 1b-1c schematically illustrate cross-sectional views of the transistor of the device of FIG. 1a in a substantially planar and a recessed drain/source configuration, respectively, in a bulk architecture.
Figure 1C:
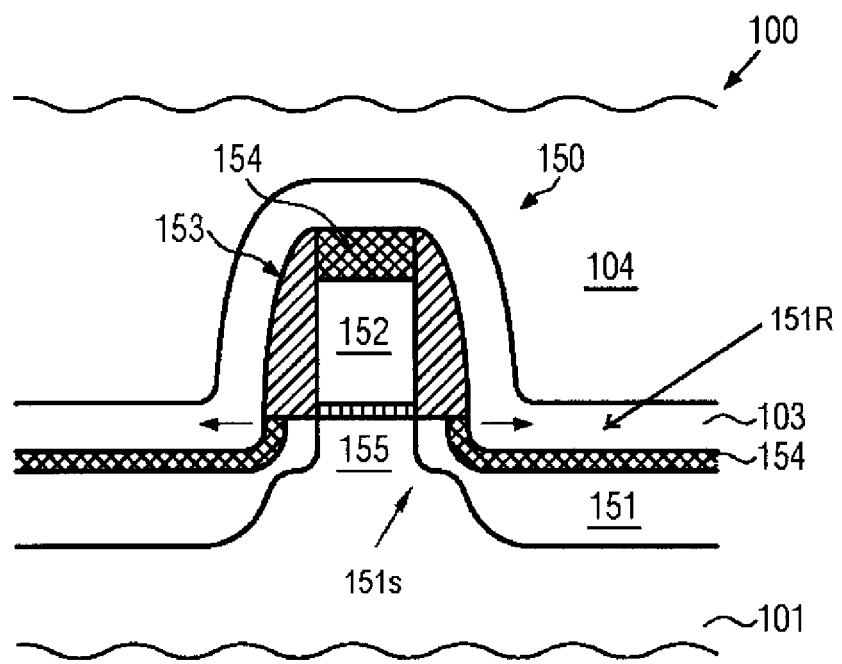
Figure 1D:
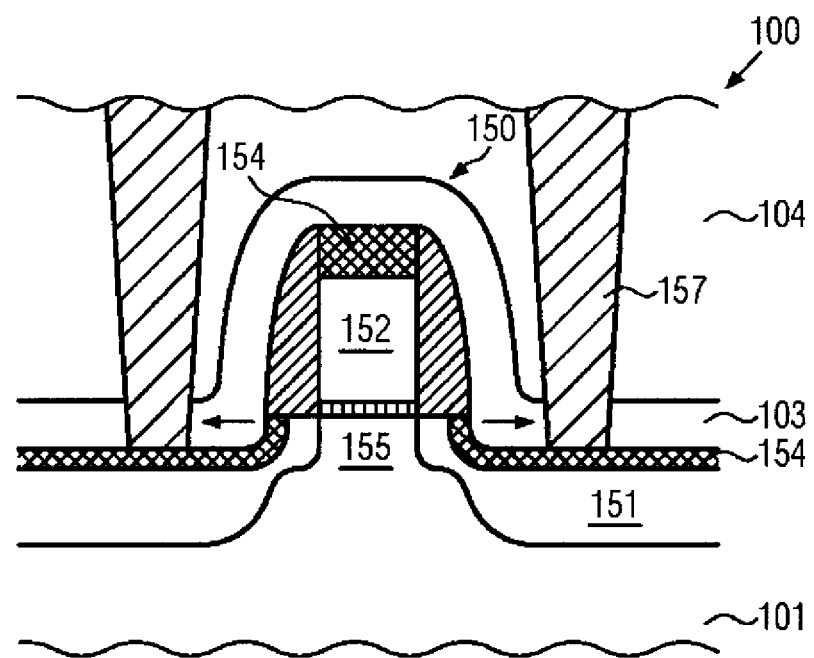
FIG. 1d schematically illustrates a cross-sectional view of the transistor shown in FIG. 1c.
Figure 1E:
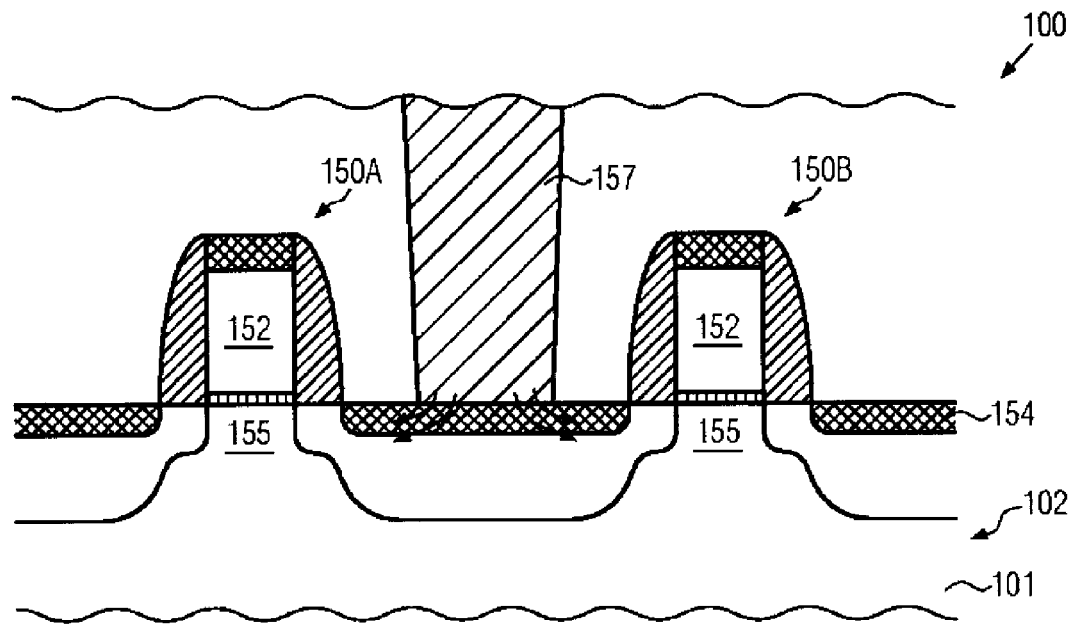
FIGS. 1e-1f schematically illustrate bulk transistor elements with a moderately wide spacing and a narrow spacing between adjacent elements having a substantially planar source/drain configuration.
Figure 1F:
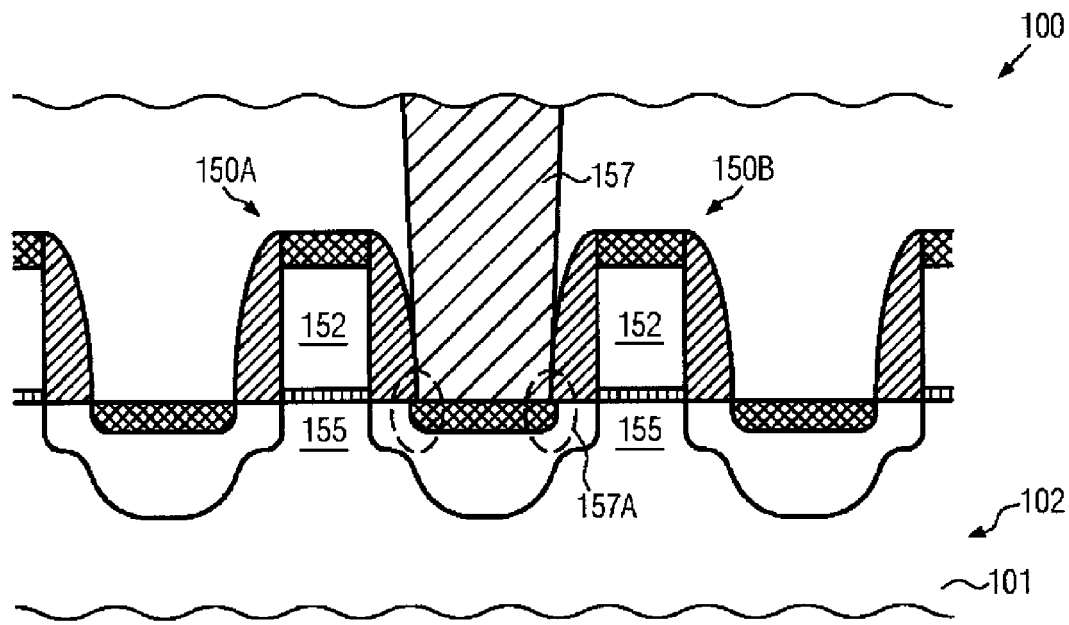
Figure 1G:
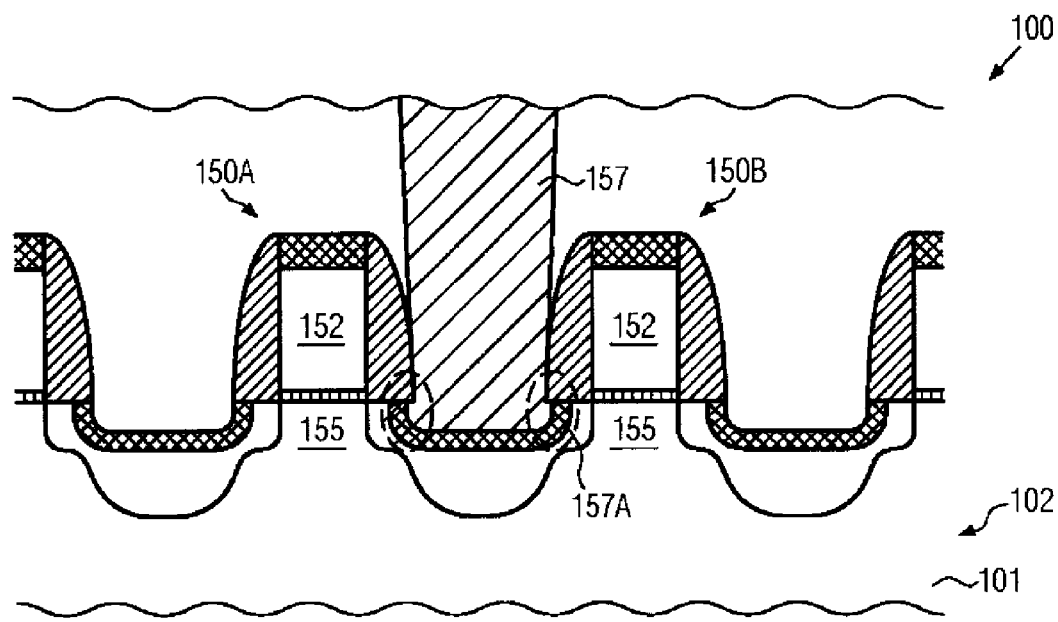
FIG. 1g schematically illustrates transistor elements having narrow spacing in between, wherein the recessed drain/source configuration provides enhanced conductivity characteristics.
Figure 5:
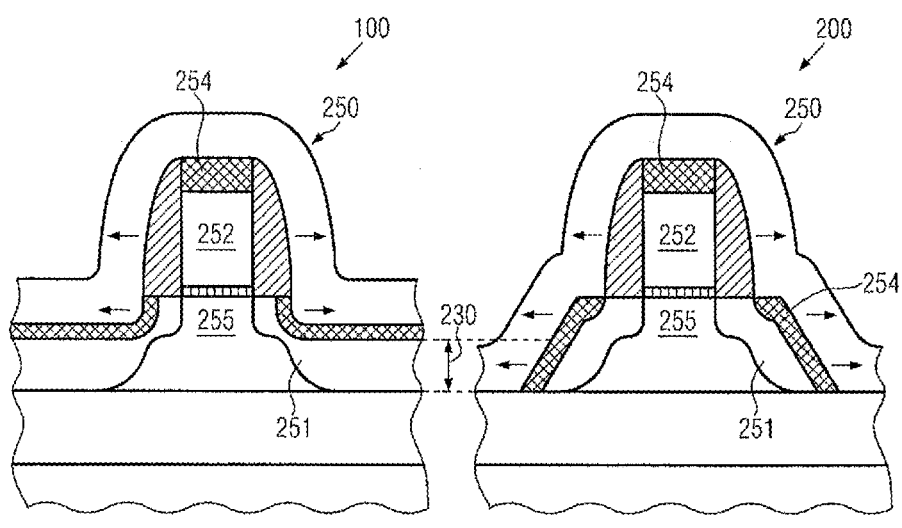
FIG. 5 schematically illustrates a conventional SOI transistor having a recessed drain/source configuration and a transistor with reduced drain and source length, according to illustrative embodiments of the present disclosure.

FIG. 5 schematically illustrates the advantages of the semiconductor device 200 compared to a conventional transistor having a recessed drain/source configuration, as for instance described with reference to FIGS. 1b and 1c. As is evident, due to the extra height 230, i.e., the difference of the thickness of the initial layer 202 and the recess 230A of the conventional transistor shown at the left hand side, which is available for a lateral stress transfer from the stressed layer 202 into the semiconductor material forming the drain and source regions 251 and the channel region 255, the corresponding overall transistor performance may be enhanced compared to the device 100. Furthermore, the entire sidewall area of the edge 251S down to the buried insulating layer 205 is available for current flow, thereby also efficiently reducing the series resistance in the transistor 250.

Figure 6:
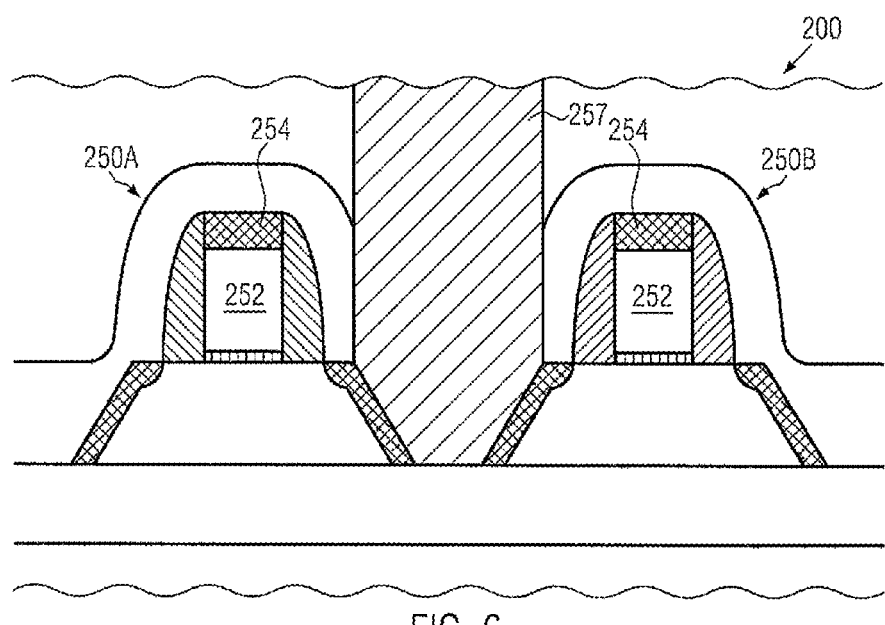
FIG. 6 schematically illustrates a cross-sectional view of a semiconductor device including transistors having reduced spacing in between, according to illustrative embodiments.

FIG. 6 schematically illustrates the semiconductor device 200 when comprising closely spaced transistors 250A, 250B, each of which may have substantially the same configuration as the transistor 250 described above. As shown, the contact 257 may encounter the respective increased sidewall areas of the edges 251S, enabling a current flow from the contact 257 into the metal silicide regions 254 down to the buried insulating layer 205, thereby also significantly relaxing any issues with respect to current crowding, even if contacts between densely spaced transistors are to be provided.

With reference to FIGS. 3a-3d, further illustrative embodiments will now be described in which exposure of a portion of buried insulating layer may occur in an earlier manufacturing stage.

Figure 3A:
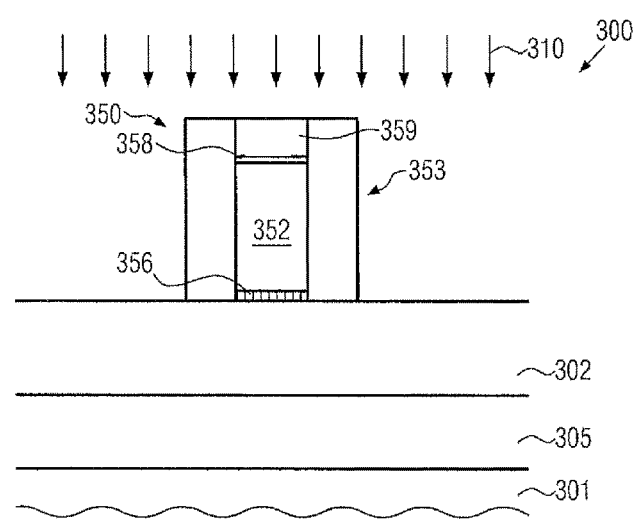
FIGS. 3a-3d schematically illustrate cross-sectional views of an SOI transistor during various manufacturing stages, wherein a recess is formed on the basis of a high temperature hydrogen bake at an earlier manufacturing stage, according to further illustrative embodiments.

FIG. 3a schematically illustrates a semiconductor device 300 comprising a transistor 350 at an early manufacturing stage. The transistor 350 may comprise a substrate 301 including a buried insulating layer 305 having formed thereon a silicon-based semiconductor layer 302. Furthermore, a gate electrode 352 may be formed above the semiconductor layer 302 and may be separated therefrom by a gate insulation layer 356. Regarding the components described so far, the same criteria may apply as previously explained with reference to the devices 100 and 200. Moreover, in this manufacturing stage, the gate electrode 352 may be encapsulated by an appropriately designed sidewall spacer structure 353 and a cap layer 359 wherein, if required, a corresponding liner 358 may be provided. It should be appreciated that in some illustrative embodiments the semiconductor device 300 may comprise other transistor areas, in which a recess may have to be formed so as to incorporate therein a respective semiconductor alloy, such as silicon/germanium and the like. Thus, respective sidewall spacers 353 and cap layers 359 may also be provided in other transistor areas. The spacer 353 may be formed on the basis of well-established spacer techniques, i.e., by conformally depositing an appropriate material, such as silicon nitride, possibly in combination with an appropriate liner material (not shown), and anisotropically etching the material so as to obtain the final spacers 353. The cap layer 359 may be formed in accordance with process techniques as previously described with reference to the cap layer 259.

Next, the device 300 may be subjected to an etch process 310 in order to remove material from exposed portions of the semiconductor layer 302. For this purpose well-established etch recipes are available in the art.

Figure 3B:
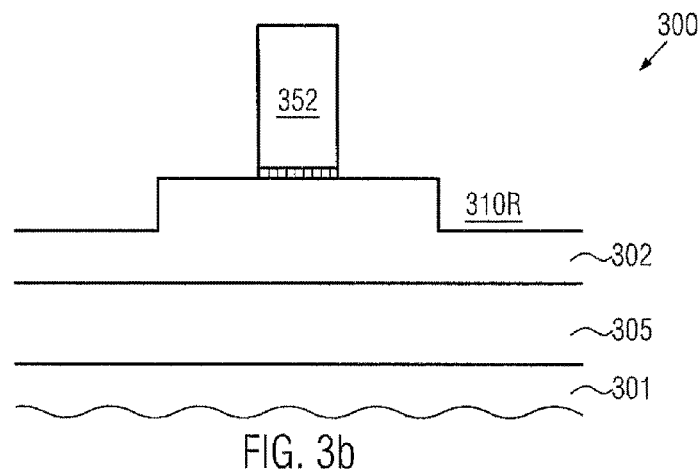

FIG. 3b schematically illustrates the device 300 after the etch process 310 and after the removal of the spacer structure 353 and the cap layer 359. Hence, a respective recess 310R may be formed in the layer 302 wherein the size and dimension of the recess 310R may possibly correspond to the size and dimension as required in other transistor types, such as P-channel transistors, which may receive a corresponding silicon/germanium material. In other cases, the dimensions of the recess 310R and in particular the offset to the gate electrode 352 may be selected in accordance with the requirements as demanded by the finally desired drain and source length.

Figure 3C:
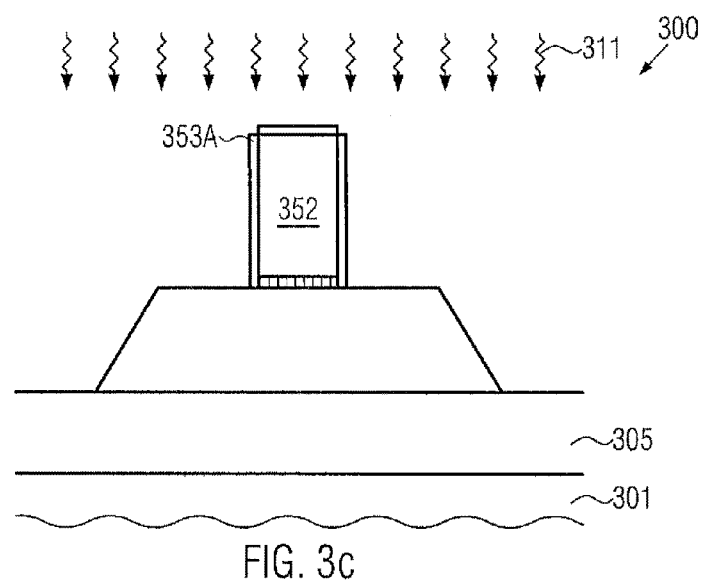

FIG. 3c schematically illustrates the semiconductor device 300 in a further advanced manufacturing stage, wherein respective offset spacers 353A may be formed on sidewalls of the gate electrode 352, which have a width as required for a subsequent implantation process for defining respective drain and source extension regions. The spacers 353A may be formed on the basis of well-established techniques, for instance by depositing an appropriate material, such as silicon dioxide and the like. Furthermore, the device 300 may be subjected to a heat treatment 311 in the presence of hydrogen, as previously described, in order to reconfigure the semiconductor material in the layer 302, thereby initiating a corresponding material flow due to the material's tendency to reduce its surface area, as previously explained. Consequently, the treatment 311 may result in a substantially exposed portion 305A of the buried insulating layer 305 thereby effectively shortening the length of drain and source regions still to be formed. Consequently, the heat treatment 311 may not substantially affect the finally obtained dopant profile, since respective PN junctions may be formed after the heat treatment 311. A corresponding implantation process may be performed on the basis of an appropriate dopant species in order to define respective extension regions in the material of the layer 302.

Figure 3D:
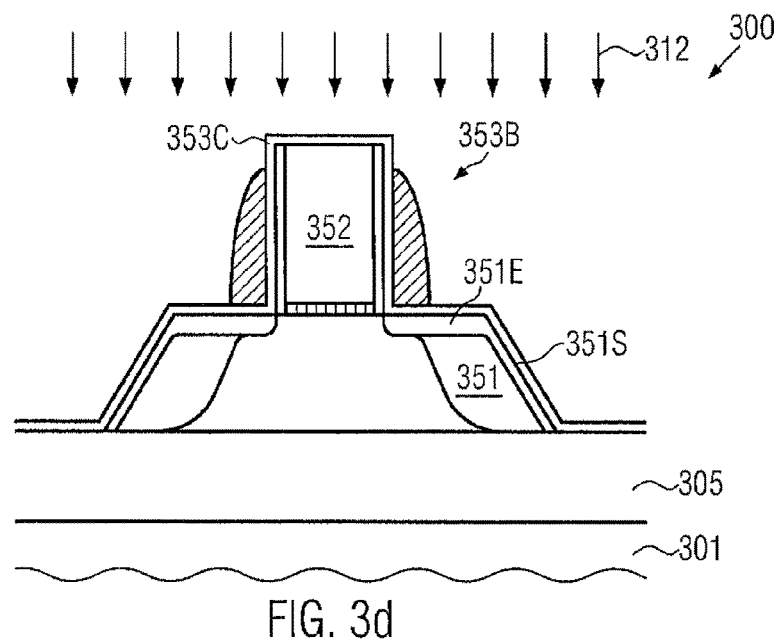

FIG. 3d schematically illustrates the semiconductor device 300 in a further advanced manufacturing stage. As shown, respective extension regions 351E may be formed in the layer 302, as previously explained. Furthermore, a spacer structure 353B including a liner 353C may be provided. The spacer 353B, in combination with the liner 353C, may be formed on the basis of well-established techniques, i.e., the material 353C may be deposited on the basis of any appropriate deposition technique, such as chemical vapor deposition (CVD) in the form of silicon dioxide and the like, in order to provide a high etch selectivity with respect to the material of the spacers 353B. Thereafter, the spacer material may be deposited in a highly conformal manner and an anisotropic etch process may be subsequently performed to obtain respective spacer elements. It should be appreciated that, due to the inclined surface 351S, the corresponding material removal during the anisotropic etch process may be less efficient compared to substantially horizontal surface portions. Consequently, the respective etch process may be performed with a certain over-etch time so as to completely remove the material from the surface portion 351S. In this case, the height of the spacers 353B may be reduced which may, however, substantially not negatively affect the further processing. In other illustrative embodiments, subsequent to the anisotropic etch process, a short highly selective isotropic etch process may be performed to substantially completely remove any material residues at the inclined sidewall portion 351S. For example, a corresponding isotropic etch process may be performed on the basis of a corresponding etch mask, which may cover other device areas that may not receive an isotropic etch treatment. The corresponding etch mask may then also be used for a subsequent ion implantation 312 for defining respective drain and source regions 351 on the basis of well-established implantation parameters. Thereafter, the further processing may be continued as previously described, i.e., by performing respective anneal cycles for activating the dopants in the drain and source regions 351 and for curing lattice damage. Thereafter, respective cleaning processes may be performed in order to prepare exposed surface portions for a metal silicide process. Consequently, the advantageous transistor configuration of a reduced drain and source length may be provided on the basis of the heat treatment 311 at an early manufacturing stage, thereby substantially avoiding any undue effects with respect to dopant diffusion, while substantially not contributing to undue process complexity. It should be appreciated that a corresponding process for forming the recess 310R may be advantageously combined with the formation of recesses in other device areas, such as P-channel transistors, thereby enhancing process uniformity during the corresponding etch process. If a subsequent selective epitaxial growth process may be performed in other device areas, a corresponding growth mask may be formed within the recess 310, for instance on the basis of an appropriately selected material layer, such as silicon dioxide and silicon nitride, which may be formed by oxidation, deposition and the like, selectively in the transistor 350.

Figure 4A:
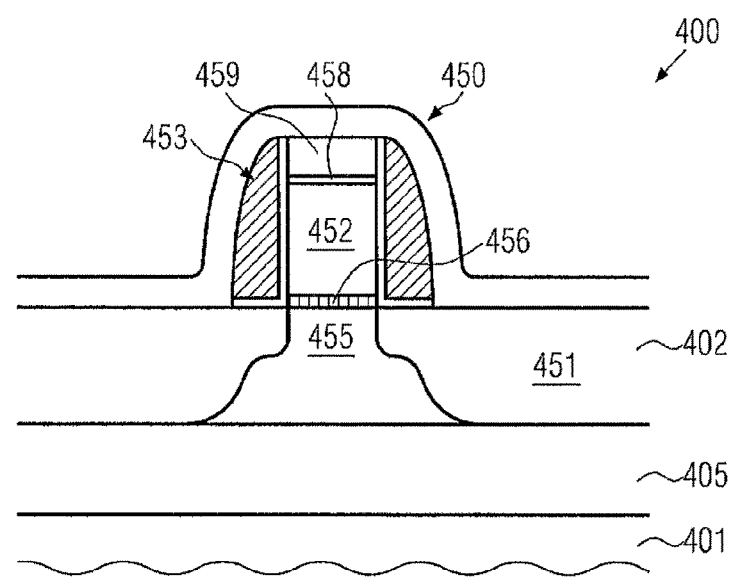
FIGS. 4a-4b schematically illustrate cross-sectional views of an SOI transistor during a process sequence for exposing a portion of a buried insulating layer in the drain and source regions, according to still further illustrative embodiments.
Figure 4B:
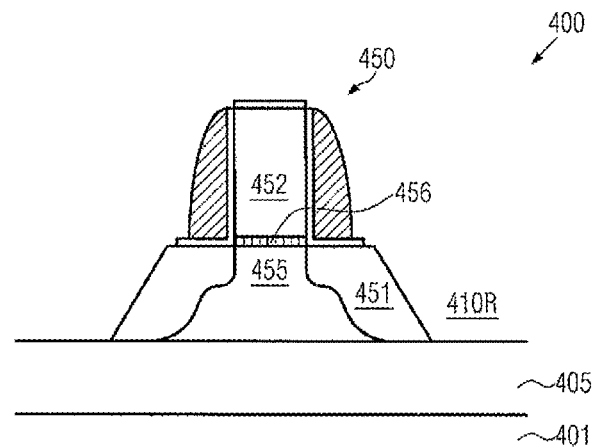

With reference to FIGS. 4a-4b, further illustrative embodiments will now be described in which the drain and source configuration may be modified on the basis of an etch process in order to expose a portion of the buried insulating layer.

FIG. 4a schematically illustrates a semiconductor device 400 comprising a transistor 450 having substantially the same configuration as the transistor 250 as shown in FIG. 2a. Thus, the device may comprise a substrate 401, a buried insulating layer 405 and a semiconductor layer 402. The transistor 450 may comprise a gate electrode 452 formed on a gate insulation layer 456, separating the gate electrode from a channel region 455 that is enclosed by respective drain and source regions 451. A sidewall spacer structure 453, which may include an appropriate liner material, may be formed on sidewalls of the gate electrode 452, which may be capped by a cap layer 459 in combination with an etch stop layer 458. The components described so far may be formed on the basis of the same process techniques as previously described.

Next, a spacer layer 440 may be formed prior to recessing the drain and source regions 451, wherein a thickness of the spacer layer 440 may be selected so as to obtain a desired offset to the PN junction in the drain and source regions 451. The spacer layer 440 may be formed of any appropriate material and may, in some illustrative embodiments, be comprised of a material having substantially the same etch rate as the material of the spacer 453 and the cap layer 459. Next, an anisotropic etch process may be performed, which may remove material of the spacer layer 440 and the materials encapsulating the gate electrode 452 while also removing material of the semiconductor layer 402. For instance, an anisotropic etch process may be performed wherein respective process parameters and etch components may be appropriately adapted in an advanced stage of the etch process to obtain an enhanced isotropic component during the etch process. Thus, during the ongoing etch process, a substantially tapered shape of the corresponding recess may be obtained. The etch process may be continued until a portion of the buried insulating layer 405 may be exposed.

FIG. 4b schematically illustrates the semiconductor device 400 after a corresponding etch sequence. Hence, the recess 410R extending down to the buried insulating layer 405 may be formed adjacent to the drain and source regions 451 with an inclined sidewall portion due to the preceding isotropic component of the etch process. Furthermore, the width of the spacers 453 also may have been reduced during the isotropic phase of the preceding etch process. However, the corresponding liner material may reliably prevent exposure of the gate electrode 452 and may also provide a desired offset for a subsequent silicidation process. Thus, based on the configuration shown in FIG. 4b, the further processing may be continued by forming the respective metal silicide regions and forming a strained dielectric material in the recess 410R, as previously explained.

As a result, the subject matter disclosed provides a technique and respective semiconductor devices obtained therefrom in which the transistor characteristics of SOI devices may be significantly enhanced by recessing drain and source regions substantially down to the buried insulating layer prior to forming respective metal silicide regions and a strained dielectric material. This may be accomplished in some aspects on the basis of a heat treatment in the presence of a hydrogen ambient at appropriate temperatures so as to induce a material flow caused by the material's tendency in reducing its surface. Thus, a tapered drain and source region with reduced effective length may be provided, thereby substantially completely removing the material from the buried insulating layer so that a corresponding stressed material may advantageously act on the drain and source region along the entire depth thereof. Thus, enhanced stress transfer and reduced series resistance may be obtained, even for highly scaled semiconductor devices comprising densely spaced transistor elements. The technique of "reducing the effective drain length" may be used for N-channel transistors and P-channel transistors, wherein, in some illustrative embodiments, the technique disclosed herein may be advantageously applied to N-channel transistors only to provide additional strain-inducing sources for this type of transistors in order to efficiently reduce the imbalance of performance gain between P-channel transistors and N-channel transistors. The corresponding process step for initiating the material flow may be incorporated at any appropriate stage without unduly affecting the overall process sequence. In still other illustrative embodiments, a corresponding removal of material from the drain and source regions in order to expose a portion of the buried insulating layer may be accomplished on the basis of an etch process, which may be performed at any appropriate manufacturing stage, for instance after completing the drain and source regions, without unduly affecting the overall manufacturing sequence.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A semiconductor device, comprising:
   a transistor formed above a buried insulating layer, said transistor comprising a gate electrode and drain and source regions located in a semiconductor material formed on said buried insulating layer, wherein said semiconductor material has a tapered profile along an edge defined between said gate electrode and said buried insulating layer; and
   a strain-inducing dielectric layer formed above said transistor and along said edge, said strain-inducing dielectric layer extending to said buried insulating layer adjacent to said drain and source regions.

2. The semiconductor device of claim 1, further comprising a contact filled with conductive material, a portion of said contact extending to said buried insulating layer.

3. The semiconductor device of claim 2, wherein said contact contacts a portion of said drain and source regions, and said drain and source regions extend to said buried insulating layer.

4. The semiconductor device of claim 1, wherein a dimension of said semiconductor material in a transistor length direction is maximal at said buried insulating layer.

5. The semiconductor device of claim 1, further comprising a metal silicide region formed in said semiconductor material at said edge and contacting said drain and source regions, said metal silicide regions extending substantially to said buried insulating layer, wherein said strain-inducing dielectric layer is formed above said metal silicide region.

6. The semiconductor device of claim 1, wherein said transistor represents an N-channel transistor.

7. The semiconductor device of claim 1, wherein said strain-inducing dielectric layer induces a tensile strain.

8. The semiconductor device of claim 1, further comprising a sidewall spacer structure adjacent to the gate electrode.

9. The semiconductor device of claim 1, wherein said tapered profile comprises a trapezoidal profile.

10. The semiconductor device of claim 1, wherein the buried insulating layer is made of silicon dioxide or silicon nitride.

11. The semiconductor device of claim 1, further comprising drain and source extension regions.

12. A semiconductor device, comprising:
    a transistor formed above a buried insulating layer, said transistor comprising a gate electrode and drain and source regions located in a semiconductor material formed on said buried insulating layer, wherein said semiconductor material has a trapezoidal profile along an edge defined between said gate electrode and said buried insulating layer;
    a strain-inducing dielectric layer formed above said transistor along said edge, said strain-inducing dielectric layer extending to said buried insulating layer adjacent to said drain and source regions; and
    a metal silicide region formed in said semiconductor material at said edge and contacting said drain and source regions, said metal silicide regions extending substantially to said buried insulating layer, wherein said strain-inducing dielectric layer is formed above said metal silicide region.

13. The semiconductor device of claim 12, further comprising another silicide region formed on a top surface of the gate electrode.

14. The semiconductor device of claim 12, wherein said strain-inducing dielectric layer induces a tensile strain.

15. The semiconductor device of claim 12, further comprising a sidewall spacer structure adjacent to the gate electrode.

16. The semiconductor device of claim 12, further comprising a contact filled with conductive material, a portion of said contact extending to said buried insulating layer.

17. The semiconductor device of claim 16, wherein said contact contacts a portion of said drain and source regions, and said drain and source regions extend to said buried insulating layer.

18. The semiconductor device of claim 12, wherein said transistor represents an N-channel transistor.

19. A semiconductor device, comprising:
    a transistor formed above a buried insulating layer, said transistor comprising drain and source regions located in a semiconductor material formed on said buried insulating layer, wherein said semiconductor material comprises a tapered edge profile that is widest at said buried insulating layer; and
    a strain-inducing dielectric layer formed above said transistor and along said edge, said strain-inducing dielectric layer extending to said buried insulating layer adjacent to said drain and source regions.

20. The semiconductor device of claim 19, wherein said transistor represents an N-channel transistor.

21. The semiconductor device of claim 19, wherein said strain-inducing dielectric layer induces a tensile strain.

22. The semiconductor device of claim 19, further comprising a metal silicide region at an edge of said drain and source regions, said metal silicide regions extending substantially to said buried insulating layer, wherein said strain-inducing dielectric layer is formed above said metal silicide region.

23. The semiconductor device of claim 19, further comprising a contact filled with conductive material, wherein said contact contacts a portion of said drain and source regions, and said drain and source regions extend to said buried insulating layer.

* * * * *